United States Patent
Fuse

(10) Patent No.: US 7,911,069 B2
(45) Date of Patent: Mar. 22, 2011

(54) SEMICONDUCTOR DEVICE AND LAYOUT METHOD THEREOF

(75) Inventor: Michino Fuse, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 298 days.

(21) Appl. No.: 12/210,269

(22) Filed: Sep. 15, 2008

(65) Prior Publication Data
US 2009/0085230 A1    Apr. 2, 2009

(30) Foreign Application Priority Data

Sep. 27, 2007  (JP) ................................ 2007-251785

(51) Int. Cl.
*H01L 23/52* (2006.01)
(52) U.S. Cl. ........ 257/786; 257/202; 257/210; 257/296; 257/690; 257/693; 257/734
(58) Field of Classification Search .................. None
See application file for complete search history.

(56) References Cited

U.S. PATENT DOCUMENTS
2002/0064908 A1 *   5/2002   Awaya .................. 438/128

FOREIGN PATENT DOCUMENTS
JP       11-233637       8/1999
JP       2009-87974      4/2009
* cited by examiner

*Primary Examiner* — N Drew Richards
*Assistant Examiner* — Kyoung Lee
(74) *Attorney, Agent, or Firm* — Taft Stettinius & Hollister LLP

(57) ABSTRACT

A semiconductor device and a layout method thereof are provided, each of which contributes to a reduction in layout area and appropriately adjusts an inter-wiring capacitance even where wiring widths and intervals in a plurality of wiring layers differ at a bus wiring comprised of the wiring layers. In the semiconductor device, a first functional block and a second functional block are connected to each other, and a plurality of wirings formed over their corresponding wiring layers are provided. The wiring layers have constant wiring widths and wiring intervals for every wiring layer. The number of wirings on each wiring layer is determined, at least in part, by multiplying (a) the total number of required wirings (for all wiring layers) by (b) a ratio of (i) a rate of wirings per unit length on the given layer versus (ii) the sum of the rates of wirings per unit length for each of the plurality of wiring layers. Where the rate of wirings per unit length on a given layer is an inverse of the sum of (x) the desired or predetermined constant wiring width for that layer and (y) the desired or predetermined constant wiring interval for that layer.

22 Claims, 4 Drawing Sheets

Expression 1

$$x_n = X \cdot \cfrac{\cfrac{1}{a_n + b_n}}{\sum_{\alpha=1}^{m}\left\{\cfrac{1}{a_\alpha + b_\alpha}\right\}}$$

SEMICONDUCTOR DEVICE AND LAYOUT METHOD THEREOF

CROSS-REFERENCE TO RELATED APPLICATIONS

This application claims priority under 35 U.S.C. §119 to Japanese Patent Application Serial No. JP2007-251785 filed on Sep. 27, 2007, entitled "Semiconductor Device and Layout Method Thereof," the disclosure of which is hereby incorporated by reference.

RELATED ART

1. Field of the Invention

The present invention relates to a semiconductor device having a plurality of wirings for connecting functional blocks, and a layout method thereof.

2. Brief Discussion of Related Art

In a conventional semiconductor device having bus wirings, the bus wirings have been arranged to avoid an increase in the difference between the lengths of the bus wirings by forming the same using the same wiring layer. This arrangement makes it easy to match wiring resistances between functional blocks to be connected and inter-wiring capacitances.

In such a semiconductor device, the area of a wiring region more than doubles if the total number of wirings is doubled. Hence, the area of a semiconductor circuit, particularly the area of the wiring area, increases. Therefore, it is known to allocate bus wirings to a plurality of layers and lay out the same using a multilayered wiring.

For example, Japanese Unexamined Patent Publication No. Hei 11(1999)-233637 has disclosed that in order to provide take-out holes for respective bit-lines, when bus lines are wired to a plurality of layers in parts, the bit lines are allocated to either odd-numbered layers or even-numbered layers and wired with their upper or lower layers being made open.

However, the prior art referred to above is limited in that it discloses that that the total number of the wirings is allocated uniformly according to the wiring layers and the wirings are formed as the multilayered wiring. But when the wiring widths and intervals in the respective wiring layers are different from one another, the allocation by such a method does not always lead to a reduction in layout area and the suitability of the wiring resistance and inter-wiring capacitance.

INTRODUCTION TO THE INVENTION

The exemplary embodiments are disclosed in view of the above problems and provide a semiconductor device and a layout method thereof contributing to a reduction in layout area and appropriately adjusting an inter-wiring capacitance even where wiring widths and intervals in respective wiring layers differ.

The exemplary embodiments provide a semiconductor device that addresses the above problems. The exemplary semiconductor device may comprise a first functional block, a second functional block, and a plurality of wirings that connect the first functional block and the second functional block and are formed over a plurality of wiring layers. The wiring layers of the exemplary embodiments have constant wiring widths and wiring intervals for every wiring layer. The number of wirings on each wiring layer in such exemplary embodiments is determined, at least in part, by multiplying (a) the total number of required wirings (for all wiring layers) by (b) a ratio of (i) a rate of wirings per unit length on the given layer versus (ii) the sum of the rates of wirings per unit length for each of the plurality of wiring layers. Where the rate of wirings per unit length on a given layer is an inverse of the sum of (x) the desired or predetermined constant wiring width for that layer and (y) the desired or predetermined constant wiring interval for that layer. If the result of such multiplication does not render integer results, it is within the scope of certain embodiments of the present invention to round tip or round down to achieve the desired integer results (number of wirings for a given wiring layer).

Thus, the embodiments exemplify how to reduce a layout area and adjust an inter-wiring capacitance appropriately even where wiring widths and intervals in respective wiring layers are different from one another.

It is a first aspect of the present invention to provide a semiconductor device that includes: a first functional block; a second functional block; and a plurality of wirings electrically connecting the first functional block and the second functional block, where the plurality of wirings are formed within a plurality of wiring layers. Each of the plurality of wiring layers includes a substantially constant wiring width and a substantially constant wiring interval between wirings and a number of wirings for each wiring layer is calculated using the substantially constant wiring width and substantially constant wring interval for each layer. In a further detailed embodiment, the substantially constant wiring width and substantially constant wiring interval for each of the plurality of wiring layers differs from layer to layer. In yet a further detailed embodiment, the substantially constant wiring width and the substantially constant wiring interval are respectively a minimum wiring width and a minimum wiring interval at each of the plurality of wiring layers.

In an alternate detailed aspect of the first aspect of the present invention, the number of wirings for a first wiring layer is calculated using, at least, a result of multiplying (a) a combined number of wirings to be positioned in the plurality of wiring layers by (b) a ratio of (i) a rate of wirings per unit length on the first wiring layer versus (ii) the sum of the rates of wirings per unit length for each of the plurality of wiring layers. In a more detailed embodiment the rate of wirings per unit length of a given wiring layer is calculated using, at least, an inverse of a sum of (x) the substantially constant wiring width for the given wiring layer and (y) the substantially constant wiring interval between wirings for the given wiring layer. In yet a more detailed embodiment, the number of wirings for the first wiring layer is further calculated by rounding the result of multiplying (a) by (b).

It is a second aspect of the present invention to provide a semiconductor device that includes: a first functional block; a second functional block; and a plurality of wirings electrically connecting the first functional block and the second functional block, where the plurality of wirings are formed within a plurality of wiring layers, where the number of wirings for a first wiring layer of the plurality of wiring layers is calculated using, at least, a result of multiplying (a) a combined number of wirings to be positioned in the plurality of wiring layers by (b) a ratio of (i) a rate of wirings per unit length on the first wiring layer versus (ii) the sum of the rates of wirings per unit length for each of the plurality of wiring layers. In a more detailed embodiment, the number of wirings for each of the wiring layers of the plurality of wiring layers is calculated using, at least, a result of multiplying (a) a combined number of wirings to be positioned in the plurality of wiring layers by (b) a ratio of (i) a rate of wirings per unit length on the respective wiring layer versus (ii) the sum of the rates of wirings per unit length for each of the plurality of wiring layers. In yet a further detailed embodiment, each of the plurality of wiring layers includes a substantially constant wiring width and a substantially constant wiring interval between wirings, and the rate of wirings per unit length of a given wiring layer is calculated using, at least, an inverse of a sum of (x) the substantially constant wiring width for the given wiring layer and (y) the substantially constant wiring interval between wirings for the given wiring layer.

It is a third aspect of the present invention to provide a layout method that includes the steps of: connecting a first functional block and a second functional block of an electronic device by a plurality of wirings formed over a plurality of wiring layers; providing substantially constant wiring widths and substantially constant wiring intervals in each of the plurality of wiring layers; and calculating a number for wirings for at least a first wiring layer of the plurality of wiring layers, wherein the calculating step includes multiplying (a) a combined number of wirings to be positioned in the plurality of wiring layers by (b) a ratio of (i) a rate of wirings per unit length on the first wiring layer versus (ii) the sum of the rates of wirings per unit length for each of the plurality of wiring layers. In a more detailed embodiment, the calculating step further includes a step of, rounding up the number of wirings to a nearest greater integer or rounding down the number of wirings to a nearest lesser integer. In yet a further detailed embodiment, a number of wirings is calculated for a plurality of the wirings layers using the calculating step and the rounding step is performed on in order of decreasing fractional portions for each of the plurality of wiring layers.

In an alternate detailed embodiment of the third aspect of the present invention, the substantially constant wiring width and the substantially constant wiring interval are respectively of a minimum wiring width and a minimum wiring interval at each of the plurality of wiring layers. In yet another alternate detailed embodiment, the calculating step further includes a step of calculating a rate of wirings per unit length of a given wiring layer using, at least, an inverse of a sum of (x) the substantially constant wiring width for the given wiring layer and (y) the substantially constant wiring interval between wirings for the given wiring layer.

It is a fourth aspect of the present invention to provide a semiconductor device that includes: a pad area having a plurality of electrode pads; a driver cell area having a plurality of output portions, where the plurality of output portions include a plurality of first output portions each of which outputs a first signal, a plurality of second output portions each of which outputs a second signal, and a plurality of third output portions each of which outputs a third signal; and a wiring area which connects the pad area and the driver cell area, the wiring area being formed using a plurality of wiring layers respectively including wirings for electrically connecting the electrode pads and the corresponding output portions, where the plurality of first, second, and third output portions are respectively connected to electrode pads via first, second and third wirings formed in respective first, second and third, wiring layers of the plurality of wiring layers. In a more detailed embodiment, the plurality of first, second, and third output portions are respectively arranged along an end of the driver cell area; and the second output portions are arranged adjacent to the first output portions, the third output portions are arranged adjacent to the second output portions, and the first output portions are arranged adjacent to the third output portions. In an alternate detailed embodiment, the first, second and third wiring layers respectively have substantially constant wiring widths and substantially constant wiring intervals, and the first, second and third wiring layers respectively have wiring numbers based on values obtained by multiplying (a) a predetermined combined number of wirings for the first, second and third wiring layers by (b) a ratio of (i) a rate of wirings per unit length on a respective one of the first, second and third wiring layers versus (ii) the sum of the rates of wirings per unit length for each of the first, second and third wiring layers. In a more detailed embodiment, when the obtained values are not entirely integers, either rounding up a non-integer value to the nearest greater integer or rounding down the non-integer to the nearest lesser integer in order of decreasing fractional portions of the obtained values of the wiring numbers of the first, second and third wiring layers.

It is a fifth aspect of the present invention to provide a method of assigning wiring busses to multiple layers of a semiconductor device, the method including: assigning a numerical value corresponding to a number of layers of a semiconductor device within which at least one bus wiring will be formed; assigning a numerical value corresponding to a number of bus wirings to be formed within the number of layers of the semiconductor device; assigning a respective constant wiring width and a respective constant wiring interval to each of the number of layers of the semiconductor device; and calculating a numerical value "x" corresponding to a number of bus wirings to be placed within a given layer "n" of the number of layers of the semiconductor device according the following equation:

$$x_n = X \cdot \frac{\frac{1}{a_n + b_n}}{\sum_{a=1}^{m}\left\{\frac{1}{a_\alpha + b_\alpha}\right\}}$$

where "X" is the numerical value corresponding to the number of bus wirings to be formed within the number of layers of the semiconductor device;

where "a" is the constant wiring width within a respective layer of the number of layers of the semiconductor device;

where "b" is the constant wiring interval within a respective layer of the number of layers of the semiconductor device; and where "m" is the numerical value corresponding to the number of layers of the semiconductor device.

DETAILED DESCRIPTION

The exemplary embodiments of the present invention are described and illustrated below to encompass a semiconductor device having a plurality of wirings for connecting functional blocks, and a layout method thereof. Of course, it will be apparent to those of ordinary skill in the art that the embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

Figure 1:
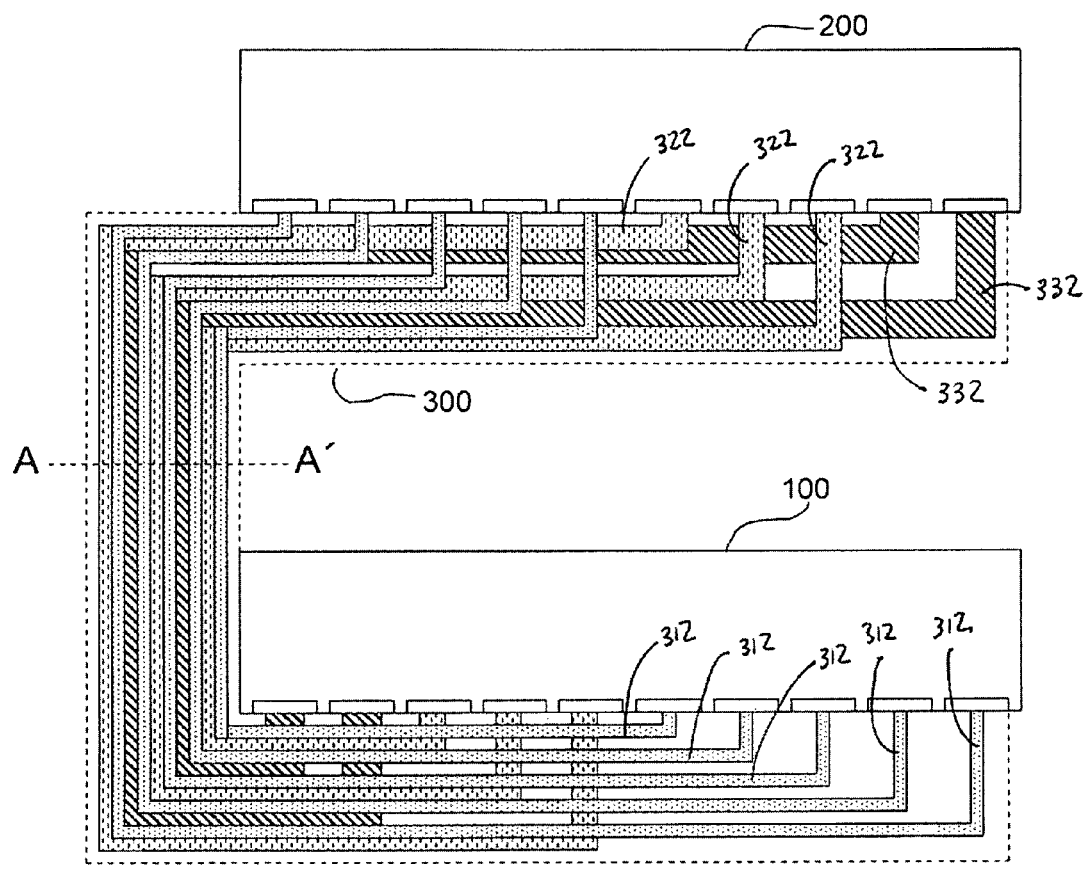
FIG. 1 is a view showing an outline of a semiconductor device according to a first exemplary embodiment of the present invention.

Referencing FIG. 1, an exemplary semiconductor device includes a first functional block 100, a second functional block 200, and a wiring area 300 formed using a bus wiring comprising a plurality of wirings for connecting the first functional block 100 and the second functional block 200.

The first functional block 100 and the second functional block 200 are areas of a semiconductor device divided according to function. Exemplary functional areas of a semiconductor device may include, without limitation, a driver cell area for a driver LSI, an electrode pad area, a memory area for holding data, and a computing area for performing an arithmetic operation. As will be described in more detail hereafter, the first functional block 100 may correspond to a driver cell area and the second functional block 200 may correspond to an electrode pad area.

In this exemplary embodiment, constant wiring widths and wiring intervals are set to the respective wiring layers. These constant wiring widths and Airing intervals are values determined, at least in part, upon semiconductor process constraints and design rules affecting wiring layout, etc.

Figure 2:
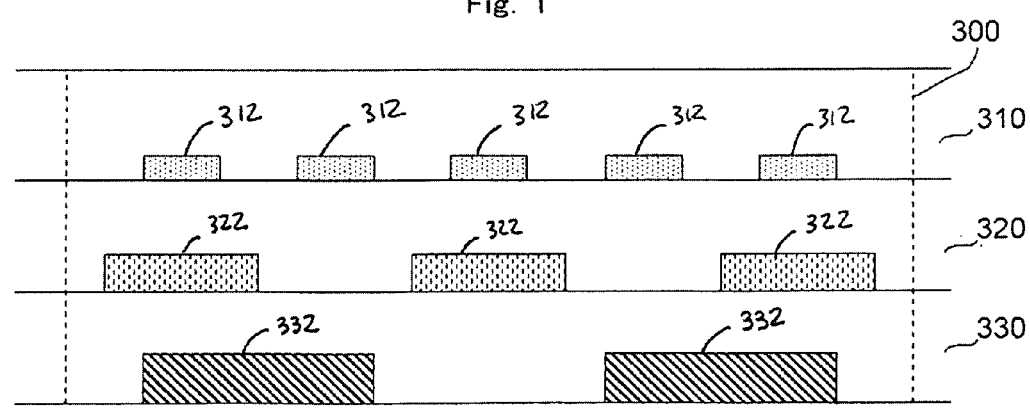
FIG. 2 is a sectional view taken along line A-A' in FIG. 1.

Referring to FIG. 2, the wiring layers within the exemplary wiring area 300 are comprised of three layers. A first wiring layer 330 corresponds to the undermost or bottom layer. A second wiring layer 320 is provided on the first wiring layer 330. A third wiring layer 310 is provided on the second wiring layer 320 and over the first wiring layer 330. In exemplary form, the wiring width and interval of the first wiring layer 330 is 3 µm, the wiring width and interval of the second wiring layer 320 is 2 µm, and the wiring width and interval of the third wiring layer 310 is 1 µm.

Referring to both FIGS. 1 and 2, the exemplary semiconductor device is shown with ten wirings for connecting the first functional block 100 and the second functional block 200. The ten wirings are divided based upon layers, with two wirings 332 being located in the first wiring layer 330, three wirings 322 being located in the second wiring layer 320, and five wirings 312 being located in the third wiring layer 310.

In order to determine how best to allocate the wirings formed in the wiring area 300 amongst the wiring layers, a calculation is performed. In order to perform this calculation, the sum of the desired or predetermined wiring width and interval at each wiring layer is first calculated, represented by Value #1. Generally, the wiring width for any given wiring layer is a requirement set forth in the overall design specification of the chip.

Next, the rate of wirings per unit width is determined by taking the inverse of this Value #1 for each layer. The sum of the rates of the wirings per unit width in the respective layers is calculated as Value #2. Then, to determine the number of wirings to be allocated in a given wiring layer, the rate of wirings per unit width in such wiring layer desired is divided by the previously-calculated sum of the rates of the wirings per unit width in each of the respective layers (Value #2). Further, the divided value (ratio) is multiplied by the total number of wirings as a whole to calculate the number of the wirings in each wiring layer desired to determine the allocated number of wirings. How many wirings should be allocated in the respective wiring layers is determined based on the so-obtained value, which may include rounding numbers to integer values as described below.

In this exemplary embodiment, the constant wiring width and interval in each wiring layer are as follows: 3 µm in the first wiring layer 330; 2 µm in the second wiring layer 320; and, 1 µm in the third wiring layer 310. If calculated specifically for this exemplary embodiment, then the rates of wirings per unit width in the first wiring layer 330, the second wiring layer 320 and the third wiring layer 310 arc respectively given as 0.17, 0.25 and 0.5. In other words, the rates for each layer are determined by taking the inverse of the sum of the interval and wiring width, or (1/(wiring width+wiring interval)), which is (1/3+3=0.17) for the first layer 330, (1/2+2=0.25) for the second layer and (1/1+1=0.50) for the third layer 310. The sum of the rates of the wirings per unit width in the respective wiring layers becomes 0.92. The number of wirings allocated to the first wiring layer 330 is calculated as 1.8 by dividing the rate of the wirings per unit width in the first wiring layer 330 by the sum total of the rates of the wirings per unit width in the respective layers and multiplying the divided value by the total number of wirings ((0.17/0.92)×10). The numbers of wirings in the second wiring layer 320 and the third wiring layer 310 are also respectively calculated as 2.7 and 5.5 in like manner.

If the calculated value is of an integer, then the calculated value becomes the number of wirings allocated to each wiring layer. However, if the calculated number of wirings for a layer is not an integer, it may be necessary to determine whether the calculated number should be rounded up or down to the nearest integer. The non-integer values are prioritized based upon the smallest deviation from the nearest integer. For example, if the calculated values were 5.89, 3.99, and 7.46, prioritization would dictate that 3.99 was first rounded up to 4, then 5.89 would be secondly rounded up to 6, and 7.46 would thirdly be rounded down to 7.

By applying the rounding and prioritization rules to the calculated number of wirings in the first, second, and third wiring layers 330, 320 and 310 as described, the value for the third layer, 1.8, and the value for the second layer, 2.7, are rounded up resulting in integers 2 and 3, respectively. In this exemplary embodiment, the number of wirings has been determined by design rules to be 10, so prioritizing and rounding the second and third layers 320, 310 confirms that the calculated value of 5.4 for the first layer should be rounded down to 5 in order to meet the aggregate design number of wirings across the three layers of 10. Accordingly, even when the calculated wiring values are not integers, the values can be adjusted to integers using the foregoing method. Thus, in this exemplary embodiment, the numbers of wirings allocated to the first wiring layer 330, the second wiring layer 320, and the third wiring layer 310 are respectively two, three, and five.

By determining the numbers of wirings allocated to the respective wiring layers using the foregoing method, the wirings can suitably be allocated to the respective wiring layers and the area of each wiring layout can be reduced, even when the wiring widths and intervals of the respective wiring layers are different from one another. The area of each wiring layout can be further reduced by setting the wiring width and the wiring interval to the minimum wiring width and the minimum wiring interval allocable for each wiring layer.

Figure 3:
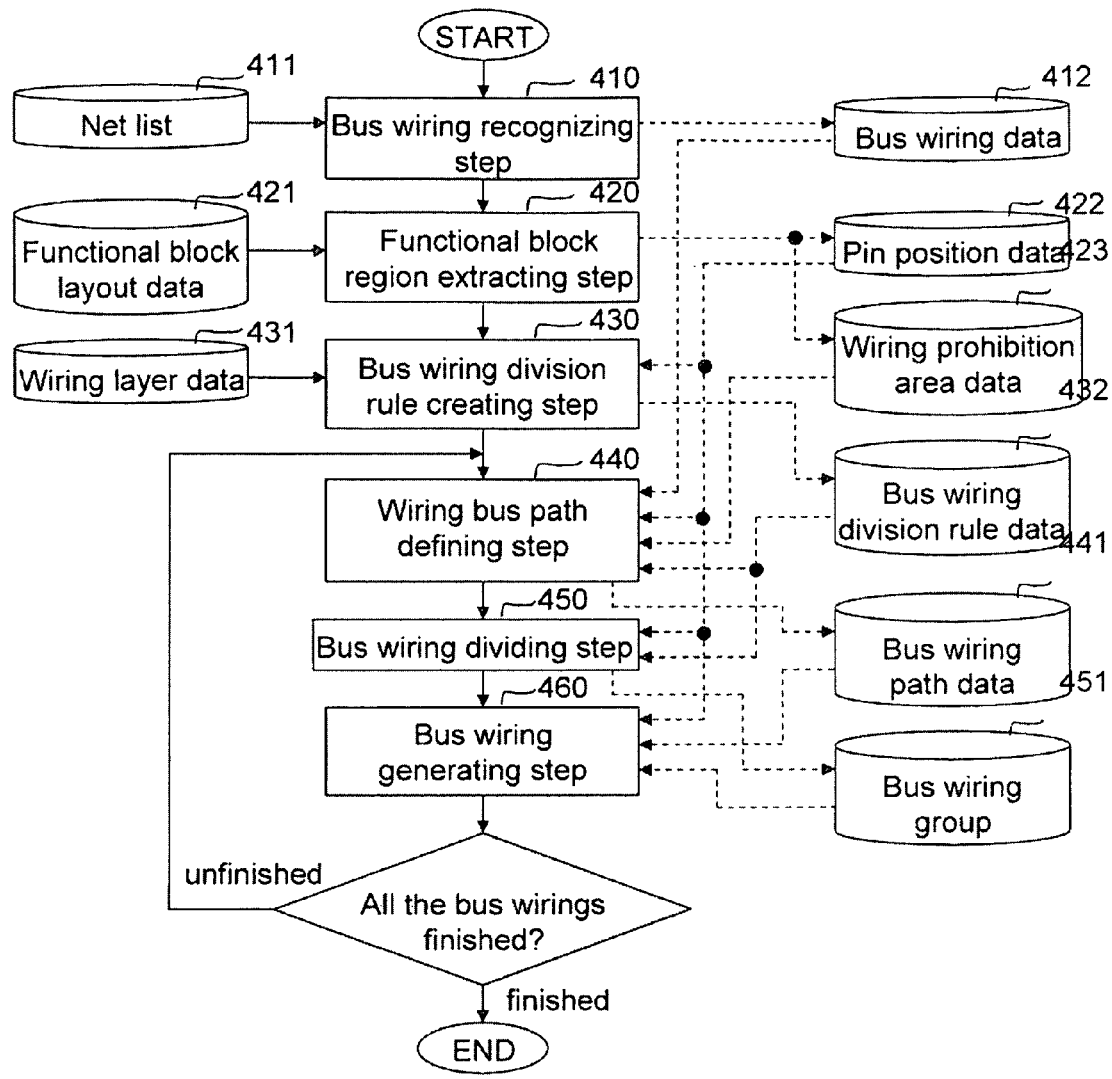
FIG. 3 is a view showing a flowchart of a method for laying out the semiconductor device according to the first exemplary embodiment.
Figure 4:
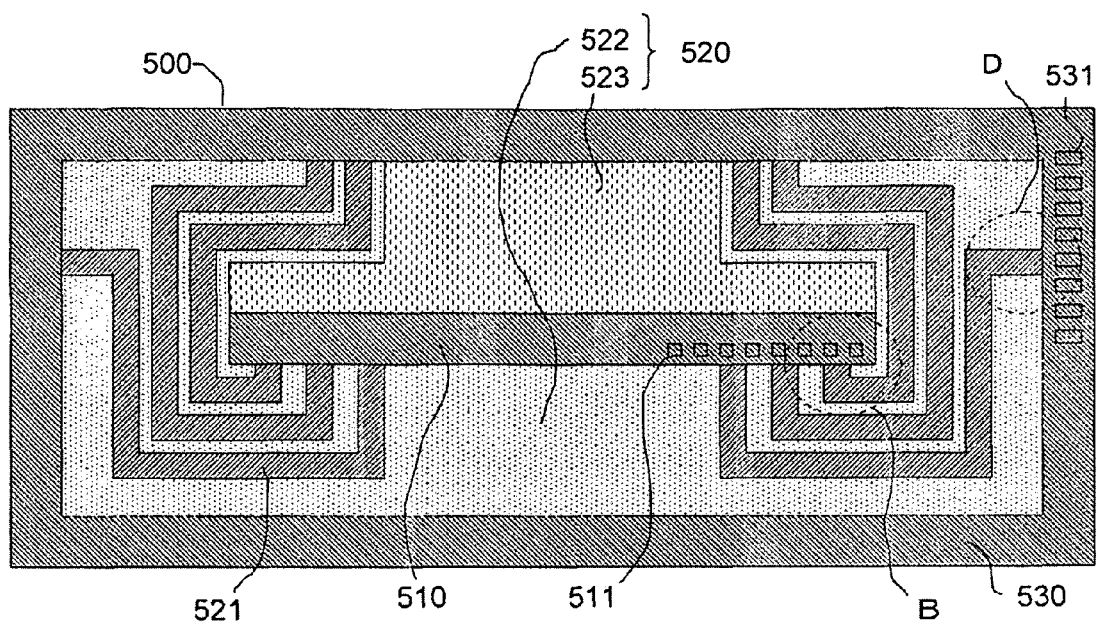
FIG. 4 is a schematic view of a drive circuit to which the first exemplary embodiment is applied.

Referring to FIG. 3, an exemplary flowchart include a bus wiring recognizing step 410, a functional block area extracting step 420, a bus wiring division rule creating step 430, a wiring path defining step 440, a bus wiring dividing step 450, and a wiring creating step 460. At the bus wiring recognizing step 410, a net list 411 of a semiconductor Circuit according to the foregoing exemplary embodiment is inputted and a connection-related wiring required to be treated as a bus wiring is extracted to generate bus wiring data 412.

Next, at the functional block area extracting step 420, information on the coordinates of positions and shapes of pins of each functional block connected to the bus wiring data 412 is next taken from functional block layout data 421 having information about the position or the like where each functional block is located or laid out to generate pin position data 422 for recognizing the positions of the start and end points of the bus wiring. In this exemplary embodiment, the graphics of the wiring layers used in the bus wiring are taken from the functional block layout data 421, based on the wiring areas in the functional blocks to generate wiring prohibition area data 423 used as information on areas where the bus wiring cannot be formed.

Next, at the bus wiring division rule creating step 430, the number of bus wirings allocated to the respective wiring layers is calculated from wiring layer data 431 with respect to the respective bus wirings. Information about the structures of the respective wiring layers and the minimum wiring widths and intervals formable in the respective wiring layers, etc., are included in the wiring layer data 431. The number of the bus wirings allocated to the respective wiring layers is outputted as bus wiring division rule data 432, based on the calculated result of the number of the bus wirings. Incidentally, a specific method for calculation will be explained later.

Thereafter, the bus wiring path defining step 440, bus wiring dividing step 450, and bus wiring generating step 460 are conducted in order for each wiring layers, starting with the layer having the least number of wirings and working in increasing order to finish with the layer having the most number of wirings, based on the bus wiring data 412.

At the wiring path defining step 440, the bus wiring data 412, pin position data 422, wiring prohibition area data 423, and bus wiring division rule data 432 are inputted, and the widths of the bus wirings in the respective wiring layers are calculated from the numbers of wirings allocated to the respective wiring layers and the minimum wiring widths and intervals allocated thereto by design rules. The maximum value of the bus wiring widths of the respective wiring layers is defined as the minimum bus wiring width necessary for the entire bus wiring. With the minimum bus wiring width as the reference, the path of each bus wiring is determined so that the wiring length is reduced, while avoiding a wiring prohibition area. For example, the bus wiring path data 441 is generated in this way.

Next, at the bus wiring dividing step 450, the pins of the functional block connected to its corresponding bus wiring are allocated to each wiring layer to allocate the bus wiring for every wiring layer, based on the bus wiring division rule data 432. The pins allocated to the same wiring layer are defined as a bus wiring group 451.

The allocation of the pins of each functional block can be set at random. It is possible to perform various settings, such as the allocation of plural pins of a given functional block to each wiring layer in order from the pin at the end thereof, the continuous allocation of pins every wiring layer, etc.

Next, at the bus wiring generating step 460, the bus wirings of the respective wiring layers are overlaid on one another to form a bus wiring, based on the pin position data 422, the bus wiring path data 441, and the bus wiring group 451. The foregoing steps are performed on the respective wiring layers so that the bus wirings can be formed by a multilayered wiring.

Referring to Equation #1 below, calculation of the number of the bus wirings allocated to the wiring layers at the bus wiring division rule creating step 430 is conducted as follows:

$$x_n = X \cdot \frac{\frac{1}{a_n + b_n}}{\sum_{a=1}^{m}\left\{\frac{1}{a_\alpha + b_\alpha}\right\}} \qquad \text{Equation \#1}$$

In Equation #1, "$x_n$" represents the number of bus wirings allocated to the nth wiring layer. "X" represents the total number of bus wirings necessary to connect the functional block 100 to the functional block 200, and "m" represents the total number of layers. Finally, "$a_n$" and "$b_n$" respectively represent the wiring width and wiring interval for an nth layer, while "$a_\alpha$" and "$b_\alpha$" respectively represent the wiring width and wiring interval for each layer summed from 1 to "m". Accordingly, the number of bus wirings $x_n$ allocated to the nth wiring layer is given by substituting respective values into Equation #1.

When the values given by Equation #1 are not an integer, it is necessary to adjust the values to an integer. At this time, an adjustment corresponding to the occupied rate of wirings per unit width is made by using the foregoing method for determining the difference between the sum of the integral parts of the given numerical values and the total number "X" of bus wirings, thereby adjusting the numerical values to integers or integral values. Using such a method makes it possible to contribute to a reduction in layout area.

Incidentally, the numbers of the bus wirings allocated to the respective wiring layers of the semiconductor device are calculated using Equation #1. In this first exemplary embodiment, by way of example, the total number of bus wirings was set at 10, the total number of wiring layers was set at three, the minimum wiring width of the first wiring layer was set at 3 μm and the minimum wiring interval thereof was set at 3 μm, the minimum wiring width of the second wiring layer was set at 2 μm and the minimum wiring interval thereof was set at 2 μm, and the minimum wiring width of the third wiring layer was set at 1 μm and the minimum wiring interval thereof was set at 1 μm. Accordingly, even when the minimum wiring width and the minimum wiring interval are respectively set for each wiring layer, the number of the bus wirings can automatically be optimized by calculating and rounding the number of bus wirings allocated to each wiring layer. Thus, even when different conditions are given with respect to the total number of bus wirings, the total number of wiring layers, and/or the minimum wiring width and interval of each wiring, it is not necessary to perform circuit design relying on the knowledge and experiences of a designer. As a result, the number of man-hours necessary for design or redesign can be reduced.

Although the foregoing exemplary embodiment includes bus wirings brought into a single multilayered wiring group, the present invention can be applied to two or more individual multilayered wiring groups.

Referencing FIGS. 4-7, an exemplary rectangular drive circuit 500 includes a driver cell area 510, a wiring area 520 that surrounds the driver cell area 510, and a pad area 530 that surrounds the wiring area 520. The driver cell area 510 includes circuit elements such as bit cells, a gray level correcting resistor, and the like (not shown), as well as pins 511 electrically connected to the circuit elements. In this exemplary embodiment, the driver cell area 510 corresponds to the functional block 100 of FIG. 1. Input signals are inputted proximate one end of the driver cell area and output signals are outputted proximate a second, opposite end of the driver cell area.

The wiring area 520 includes a bus wiring 521 and corresponds to the wiring area 300 of FIG. 1. The bus wiring 521 comprises a plurality of wirings that may be formed in a plurality of wiring layers. The wiring area 520 includes a first wiring area 522 for outputting the output signals to the pad area 530, and a second wiring area 523 for inputting the input signals from the pad area 530. The pad area 530 includes electrode pads 531 connected to an external package or the like. In this exemplary embodiment, the pad area 530 corresponds to the functional block 200 in FIG. 1.

Figure 5:
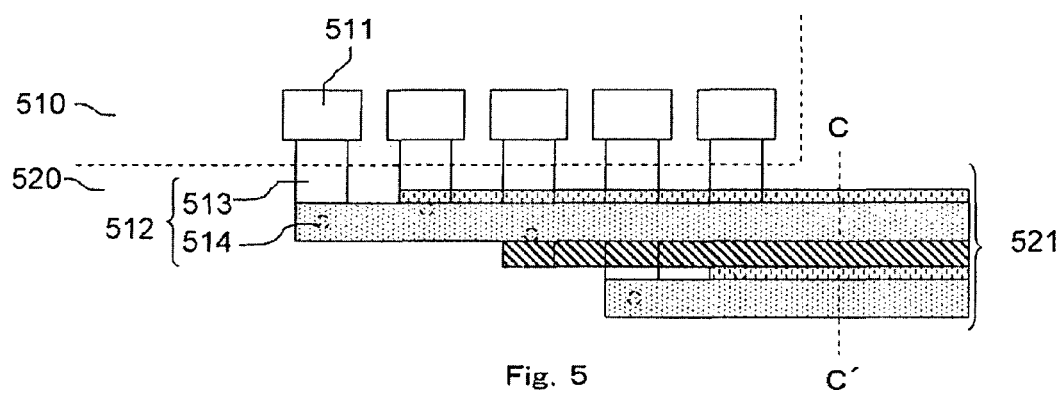
FIG. 5 is a partly enlarged view of an area B shown in FIG. 4.

Referring to FIG. 5, the pins 511 are connected to the unillustrated circuit elements or the like in the driver cell area 510 and may also be used as output portions or parts that output generated signals to the bus wiring 521 by way of a first conductive portion or section 512. The first conductive portion 512 comprises first lead wirings 513 that extend from the pins 511 to the wiring area 520, and first connecting portions 514 that connect the first lead wirings 513 and the wirings that constitute the bus wiring 521.

Figure 6:
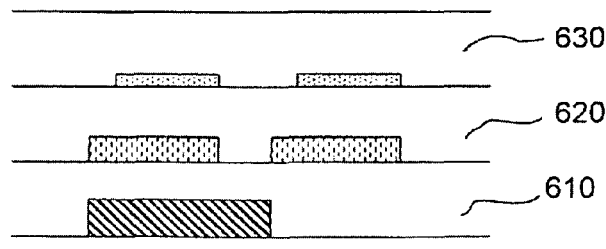
FIG. 6 is a sectional view taken along line C-C' in FIG. 5.

Referring to FIGS. 5 and 6, the bus wiring 521 has a plurality of wirings formed in a plurality of wiring layers. The wiring layer comprises a first wiring layer 610 used as the undermost layer, a second wiring layer 620 formed over the first wiring layer 610 and a third wiring layer 630 formed over the second wiring layer 620.

The first lead wirings 513 may be formed in any or the wiring layers 610, 620, 630 or in other layers. While the first lead wirings 513 and the corresponding wirings formed in the first, second, and third wiring layers 610, 620, 630 are connected by the first connecting portions 514, it is also within the scope of the invention to establish electrical communication with the first connecting portions 514 by way of contact holes, via holes, or the like. The pins 511 for outputting output signals, which are formed in the driver cell area 510, output signals from the unillustrated circuit elements formed in the driver cell area 510. In exemplary form, the pins 511 output RGB signals, i.e., an R signal, a G signal, and a B signal, and the like.

In exemplary form, the pins 511, which output the same R signal, G signal, and B signal, may be connected to their corresponding wirings formed in the same wiring layer. The bus wiring 521 can be configured by connecting the pins 511 to the wirings respectively formed in the first wiring layer 610 for the R signal, the second wiring layer 620 for the C signal, and the third wiring layer 630 for the B signal. Resistance adjustments can independently be made to the respective RGB signals by connecting the wirings formed in the wiring layers of the bus wiring 521 in this way, whereby the timings provided to perform output operations can be adjusted. That is, even when a malfunction arises where the timing provided for the output operation deviates due to a delay or the like at any of the RGB signals, the output operation timing can simply be adjusted or controlled by adjusting the layout of the bus wiring without making an adjustment to each internal circuit itself. At this time, as to the arrangement of the pins 511 for outputting the R signal, G signal, and B signal, the pins for outputting the same type of signal may preferably be disposed at two-pin intervals so that the pint 511 for outputting the G signal is disposed adjacent to the pin 511 for outputting the R signal, the pin 511 for outputting the B signal is disposed adjacent to the pin 511 for outputting the G signal, and the pin 511 for outputting the R signal is disposed adjacent to the pin 511 for outputting the B signal. With such an arrangement, the first conductive portion 512 for connecting to the wirings in the same wiring layer can be enhanced in the degree of freedom of design as in the case where resistance adjustments can be made according to the shape of each lead wiring 513 and the sizes and number of the first connecting portions 514 and the like, for example.

Further, when the arrangement of the pins 511 from which the RGB signals are outputted is equivalent to one in which the pin 511 for outputting the G signal is disposed adjacent to the pin 511 for outputting the R signal, the pin 511 for outputting the B signal is disposed adjacent to the pin 511 for outputting the G signal, and the pin 511 for outputting the R signal is disposed adjacent to the pin 511 for outputting the B signal, and the RGB signals are regularly arranged with the three pins as one set, the same output signals of every other set may be connected to the wirings of the same wiring layer where only one signal is viewed, for example. In other words, the R signal of every other set, the G signal of every other set, and the B signal of every other set may be connected to their corresponding wirings respectively formed in the first wiring layer 610, the second wiring layer 620, and the third wiring layer 630. Even when signals, which the adjacent sets of RGB signals have reverse polarity, arc outputted by connecting the RGB signals of the same polarity to the wirings formed in the same wiring layer, the inter-wiring capacitance can be reduced and a delay in signal can be prevented as compared with the case in which the RGB signals of opposite polarity are laid out adjacent to the same wiring layer. The influence of the characteristics between the wirings can be suppressed even by forming each wiring set to a ground potential between the wirings. Incidentally, the R, G, and B signals different in polarity may also be connected to the corresponding wirings formed in the same wiring layer in like manner. At this time, the respective sets of same signals are respectively formed at the wirings formed in the different wiring layers, or the different bus wirings are provided with being sufficiently spaced even in the same wiring layer.

Figure 7:
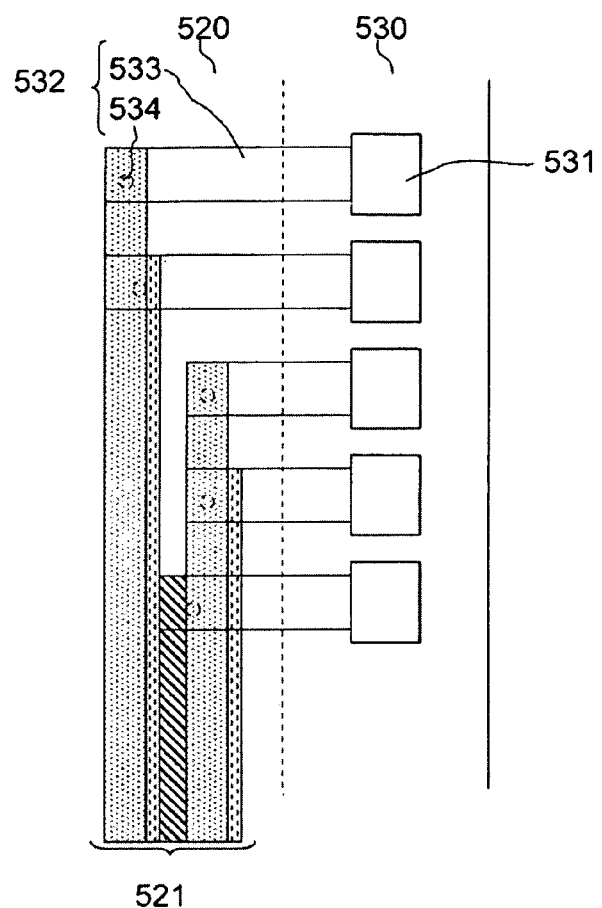
FIG. 7 is a partly enlarged view of an area D shown in FIG. 4.

Referring to FIG. 7, a second conductive section or portion 532 establishes electrical communication between the electrode pads 531 and the bus wiring 521. The second conductive portion 532 comprises second lead wirings 533 each of which extends from the electrode pad 531 to the wiring area 520, and second connecting portions 534 that connect the second lead wirings 533 and their corresponding wirings that constitute the bus wiring. The second lead wirings 533 may be formed in any of the first, second, and third wiring layers in a manner similar to the first lead wirings 513 or may be formed in other layers. The second connecting portions 534 are connected to their corresponding wirings constituting the bus wiring in a manner similar to the first connecting portions 514. At this time, however, the second connecting portions 534 may be brought into electrical communication with contact holes, via holes, or the like in the respective wiring layers.

The multilayered wiring described in the foregoing exemplary embodiment can be used for the wiring 521 in the drive circuit 500. Thus, it is possible to reduce the layout area of the bus wiring and to reduce the inter-wiring capacitance between the wirings and prevent a wiring delay. Applying the multilayered wiring of the exemplary embodiment to the wirings for transmitting the RGB signals by priority makes it possible to reduce the inter-wiring capacitance based on the combination of the wirings connected to the wiring layers, prevent a delay, and achieve a reduction in the layout area.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A semiconductor device comprising:
    a first functional block;
    a second functional block; and
    a plurality of wirings electrically connecting the first functional block and the second functional block, where the plurality of wirings are formed within a plurality of wiring layers,
    wherein each of the plurality of wiring layers includes a substantially constant wiring width and a substantially constant wiring interval between wirings, and
    wherein a number of wirings for each wiring layer is calculated using the substantially constant wiring width and substantially constant wring interval for each layer.

2. The semiconductor device according to claim 1, wherein the substantially constant wiring width and substantially constant wiring interval for each of the plurality of wiring layers differs from layer to layer.

3. The semiconductor device according to claim 2, wherein the substantially constant wiring width and the substantially constant wiring interval are respectively a minimum wiring width and a minimum wiring interval at each of the plurality of wiring layers.

4. The semiconductor device according to claim 1, wherein the first functional block includes a driver cell area having a bit cell, and the second functional block includes a pad area having an electrode pad.

5. The semiconductor device according to claim 1, wherein the substantially constant wiring width and the substantially constant wiring interval are respectively a minimum wiring width and a minimum wiring interval at each of the plurality of wiring layers.

6. The semiconductor device according to claim 1, wherein the first functional block includes a driver cell area having a bit cell, and the second functional block includes a pad area having an electrode pad.

7. The semiconductor device according to claim 1, wherein the number of wirings for a first wiring layer is calculated using, at least, a result of multiplying (a) a combined number of wirings to be positioned in the plurality of wiring layers by (b) a ratio of (i) a rate of wirings per unit length on the first wiring layer versus (ii) the sum of the rates of wirings per unit length for each of the plurality of wiring layers.

8. The semiconductor device according to claim 7, wherein the rate of wirings per unit length of a given wiring layer is calculated using, at least, an inverse of a sum of (x) the substantially constant wiring width for the given wiring layer and (y) the substantially constant wiring interval between wirings for the given wiring layer.

9. The semiconductor device according to claim 8, wherein the number of wirings for the first wiring layer is further calculated by rounding the result of multiplying (a) by (b).

10. The semiconductor device according to claim 7, wherein the number of wirings for the first wiring layer is further calculated by rounding the result of multiplying (a) by (b).

11. A semiconductor device comprising:
    a first functional block;
    a second functional block; and
    a plurality of wirings electrically connecting the first functional block and the second functional block, where the plurality of wirings are formed within a plurality of wiring layers,
    wherein the number of wirings for a first wiring layer of the plurality of wiring layers is calculated using, at least, a result of multiplying (a) a combined number of wirings to be positioned in the plurality of wiring layers by (b) a ratio of (i) a rate of wirings per unit length on the first wiring layer versus (ii) the sum of the rates of wirings per unit length for each of the plurality of wiring layers.

12. The semiconductor device according to claim 11, where the number of wirings for each of the wiring layers of the plurality of wiring layers is calculated using, at least, a result of multiplying (a) a combined number of wirings to be positioned in the plurality of wiring layers by (b) a ratio of (i) a rate of wirings per unit length on the respective wiring layer versus (ii) the sum of the rates of wirings per unit length for each of the plurality of wiring layers.

13. The semiconductor device according to claim 12, wherein:
    each of the plurality of wiring layers includes a substantially constant wiring width and a substantially constant wiring interval between wirings, and
    the rate of wirings per unit length of a given wiring layer is calculated using, at least, an inverse of a sum of (x) the substantially constant wiring width for the given wiring layer and (y) the substantially constant wiring interval between wirings for the given wiring layer.

14. A layout method comprising the steps of:
    connecting a first functional block and a second functional block of an electronic device by a plurality of wirings formed over a plurality of wiring layers;
    providing substantially constant wiring widths and substantially constant wiring intervals in each of the plurality of wiring layers; and
    calculating a number for wirings for at least a first wiring layer of the plurality of wiring layers, wherein the calculating step includes multiplying (a) a combined number of wirings to be positioned in the plurality of wiring layers by (b) a ratio of (i) a rate of wirings per unit length on the first wiring layer versus (ii) the sum of the rates of wirings per unit length for each of the plurality of wiring layers.

15. The layout method according to claim 14, wherein the calculating step further includes a step of, rounding up the number of wirings to a nearest greater integer or rounding down the number of wirings to a nearest lesser integer.

16. The layout method of according to claim 14, wherein a number of wirings is calculated for a plurality of the wirings layers using the calculating step and the rounding step is performed on in order of decreasing fractional portions for each of the plurality of wiring layers.

17. The layout method according to claim 14, wherein the substantially constant wiring width and the substantially constant wiring interval are respectively of a minimum wiring width and a minimum wiring interval at each of the plurality of wiring layers.

18. The layout method of claim 14, wherein the calculating step further includes a step of calculating a rate of wirings per unit length of a given wiring layer using, at least, an inverse of a sum of (x) the substantially constant wiring width for the given wiring layer and (y) the substantially constant wiring interval between wirings for the given wiring layer.

19. A semiconductor device comprising:

a pad area having a plurality of electrode pads;

a driver cell area having a plurality of output portions, where the plurality of output portions include a plurality of first output portions each of which outputs a first signal, a plurality of second output portions each of which outputs a second signal, and a plurality of third output portions each of which outputs a third signal; and a wiring area which connects the pad area and the driver cell area, the wiring area being formed using a plurality of wiring layers respectively including wirings for electrically connecting the electrode pads and the corresponding output portions, wherein the plurality of first, second, and third output portions are respectively connected to electrode pads via first, second and third wirings formed in respective first, second and third, wiring layers of the plurality of wiring layers.

20. The semiconductor device according to claim 19, wherein:

the plurality of first, second, and third output portions are respectively arranged along an end of the driver cell area; and the second output portions are arranged adjacent to the first output portions, the third output portions are arranged adjacent to the second output portions. and the first output portions are arranged adjacent to the third output portions.

21. The semiconductor device according to claim 19, wherein:

the first, second and third wiring layers respectively have substantially constant wiring widths and substantially constant wiring intervals, and wherein the first, second and third wiring layers respectively have wiring numbers based on values obtained by multiplying (a) a predetermined combined number of wirings for the first, second and third wiring layers by (b) a ratio of (i) a rate of wirings per unit length on a respective one of the first, second and third wiring layers versus (ii) the sum of the rates of wirings per unit length for each of the first, second and third wiring layers 22. The semiconductor device according to claim 21, wherein when the obtained values are not entirely integers, either rounding up a non-integer value to the nearest greater integer or rounding down the non-integer to the nearest lesser integer in order of decreasing fractional portions of the obtained values of the wiring numbers of the first, second and third wiring layers.

* * * * *